US 7,344,927 B2

(12) United States Patent
Tsujimura et al.

(10) Patent No.: US 7,344,927 B2
(45) Date of Patent: Mar. 18, 2008

(54) METHOD AND APPARATUS FOR MANUFACTURING ACTIVE MATRIX DEVICE INCLUDING TOP GATE TYPE TFT

(75) Inventors: Takatoshi Tsujimura, Fujisawa (JP); Osamu Tokuhiro, Shiga-ken (JP); Mitsuo Morooka, Kawasaki (JP); Takashi Miyamoto, Chofu (JP)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 09/681,643

(22) Filed: May 15, 2001

(65) Prior Publication Data

US 2002/0016026 A1    Feb. 7, 2002

(30) Foreign Application Priority Data

May 26, 2000    (JP)    ............................. 2000-156007

(51) Int. Cl.
*H01L 21/00*    (2006.01)
(52) U.S. Cl. ...................... 438/151; 438/722; 438/800; 257/E21.256
(58) Field of Classification Search ................ 438/149, 438/153, 30, 151, 722, 800; 118/723
See application file for complete search history.

(56) References Cited

U.S. PATENT DOCUMENTS

| | | | | |
|---|---|---|---|---|
| 5,589,233 A * | 12/1996 | Law et al. | ................... | 427/579 |
| 5,788,778 A * | 8/1998 | Shang et al. | .................... | 134/1 |
| 5,976,900 A * | 11/1999 | Qiao et al. | ...................... | 438/14 |
| 6,066,519 A * | 5/2000 | Gardner et al. | ............. | 438/197 |
| 6,072,193 A * | 6/2000 | Ohnuma et al. | ............. | 257/347 |
| 6,180,438 B1 * | 1/2001 | Deane et al. | ................ | 438/149 |

* cited by examiner

*Primary Examiner*—David W. Coleman
(74) *Attorney, Agent, or Firm*—Ido Tuchman

(57) ABSTRACT

A method and an apparatus are provided for manufacturing an active matrix device including a top gate type TFT. A manufacturing process of the top gate type TFT includes the steps of forming an oxide film on the inner wall of a CVD processing chamber and arranging a substrate having source and drain electrodes formed thereon in the processing chamber. Additional steps include doping the source and drain electrodes with P, and forming an a-Si layer and a gate insulating film in the processing chamber. Furthermore, an apparatus is provided for manufacturing an active matrix device including a top gate type TFT having the inner surface of the processing chamber coated with the oxide film.

15 Claims, 5 Drawing Sheets

METHOD AND APPARATUS FOR MANUFACTURING ACTIVE MATRIX DEVICE INCLUDING TOP GATE TYPE TFT

BACKGROUND OF THE INVENTION

1. Field of the Invention

The present invention relates to a method and an apparatus for manufacturing an active matrix device including a TFT. More particularly, the present invention relates to a method and an apparatus for enabling efficient manufacturing of an active matrix device by including a top gate type TFT.

2. Background Art

A top gate type TFT is a thin-film transistor structure frequently used in a device including an active matrix structure (referred to as an active matrix device, hereinafter). Such frequent use of the top gate type TFT is attributed to the fact that as it can be manufactured with a smaller number of manufacturing process than that for a conventional bottom gate type TFT, TFT manufacturing costs and thus manufacturing costs of the active matrix device can be reduced. As a device using such an active matrix structure, a liquid crystal display or an electroluminescence display (EL display) using an oxide or an organic material can be cited.

In the conventional manufacturing process of the top gate type TFT, P doping is normally carried out by using phosphine ($PH_3$) to form a contact layer. In this process, source and drain electrodes are doped with P by spraying plasma generated by gas containing $PH_3$ on the surfaces of the source and drain electrodes. In the region doped with P, the doped P species migrate during the formation of an Amorphous Silicon (a-Si) layer carried out after P doping, and the corresponding region forms an n+ layer.

During the P doping, $PH_3$ is used as described above, and chemical species containing P are generated by forming plasma. Thus, chemical species containing P remain in a processing chamber for performing each following processes, in most cases in the inner wall of a vacuum container. Such chemical species containing P left in the inner wall of the processing chamber are taken in an a-Si layer or a gate insulating film during the formation of the Amorphous Silicon (a-Si) layer or an Silicon Nitride (SiNx) layer used as the gate insulating film, which is carried out after P doping. Consequently, an OFF-state current of the TFT is deteriorated.

To remove such an adverse effect of the P doping step, the conventional manufacturing process of the top gate type TFT generally employs a method of using a typical single wafer CVD device, executing P doping and formation of an a-Si layer and a gate insulating film in a plurality of different processing chambers, and then carrying a substrate doped with P among these processing chambers in vacuum.

However, in the foregoing manufacturing method of the top gate type TFT using the plurality of processing chambers, the deterioration of TFT characteristics is inevitable. This problem occurs because of the sticking of so-called degassed components to the a-Si layer and the gate insulating film. Such degassed components are emitted from the inner wall of the processing chamber to both surfaces of the source and drain electrodes during vacuum-carrying from one processing chamber to another.

The top gate type TFT can be manufactured without such inconvenience by using a plurality of different processing chambers, e.g., two processing chambers, to execute P doping and form an a-Si layer and a gate insulating layer, respectively. However, the use of two processing chambers may reduce TFT throughput, leading to a considerable reduction in productivity, and manufacturing costs for an active matrix device including the top gate type TFT may even be raised.

Considering the foregoing problems, there is a need to provide a manufacturing method and a manufacturing apparatus, which are capable of preventing any adverse effects from being given to TFT characteristics, improving productivity, and reducing manufacturing costs for an active matrix device including a top gate type TFT.

SUMMARY OF THE INVENTION

In accordance with an aspect of the present invention made with the foregoing problems in mind, a manufacturing method of an active matrix device including a top gate type TFT is provided. This manufacturing method comprises a process of forming the top gate type TFT, comprising the steps of: forming an oxide film on an inner wall of a CVD processing chamber; arranging a substrate having source and drain electrodes formed therein in the processing chamber; doping the source and drain electrodes with P; and forming an a-Si layer and a gate insulating film in the processing chamber.

In accordance with another aspect of the present invention, a manufacturing apparatus for an active matrix device including a top gate type TFT is provided. This apparatus comprises a CVD processing chamber for forming the top gate type TFT. A removable oxide film is formed on an inner wall of the processing chamber for forming the top gate type TFT, and P doping and formation of an a-Si layer and a gate insulting film are carried out in the same processing chamber.

Now, the present invention will be described in detail with reference to the accompanying drawings. In this case, an active matrix device is assumed to be applied as a liquid crystal display. It should be understood that the embodiments shown are only illustration of the present invention, and thus the present invention is not limited to the embodiments.

DETAILED DESCRIPTION

According to the present invention, the process of forming the top gate type TFT may further comprises the process of removing the oxide film from the inner wall after the formation of the a-Si layer and the gate insulating film. In the present invention, the oxide film should preferably contain SiOx. The active matrix device should preferably be a liquid crystal display in the present invention. Further, according to the present invention, the active matrix device should preferably be an electroluminescence display.

Figure 1:
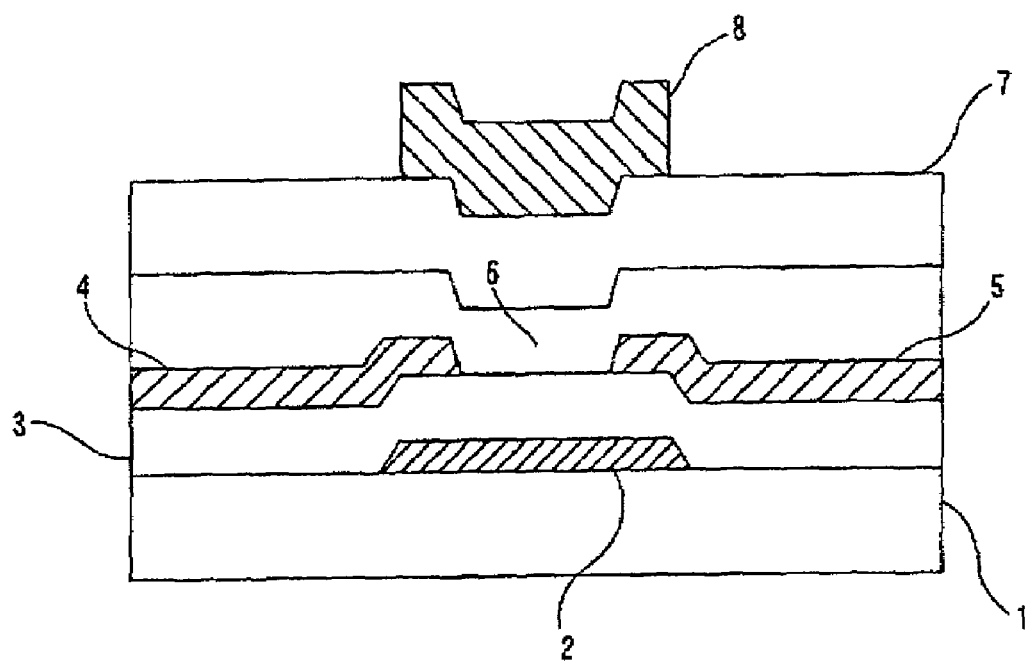
FIG. 1 is a schematic sectional view showing a structure of a top gate type TFT included in an active matrix device manufactured according to the present invention.

FIG. 1 is a schematic view showing in section a top gate type TFT structure using an a-Si layer, which is included in an active matrix device applied as a liquid crystal display formed by a manufacturing method of the present invention. As shown in FIG. 1, the top gate type TFT manufactured according to the present invention includes a light shielding layer 2 provided on a glass substrate 1 to prevent a light from being made incident from the same, and an insulating layer 3 provided to cover the glass substrate 1 and the light shielding layer 2. On the surface of the insulating film 3 opposing to the glass substrate 1, drain and source electrodes 4 and 5 are formed. The top gate type TFT shown in FIG. 1 further includes an a-Si layer 6 formed to cover the drain and source electrodes 4 and 5, and a gate insulating film 7 formed as an upper layer of the a-Si layer 6 by depositing, for example, SiNx. A gate electrode 8 is provided on the gate insulating film 7, and thus a device structure is provided to enable ON/OFF operations. According to the present invention, in order to form the foregoing components, any materials and structures that have been known can be used. If the present invention is applied to an electroluminescence display, among the above components, any insulative substrate can be used instead of the glass substrate 1. If an opaque insulative substrate is used, then it is not necessary to use the light shielding layer 2.

Figure 2:
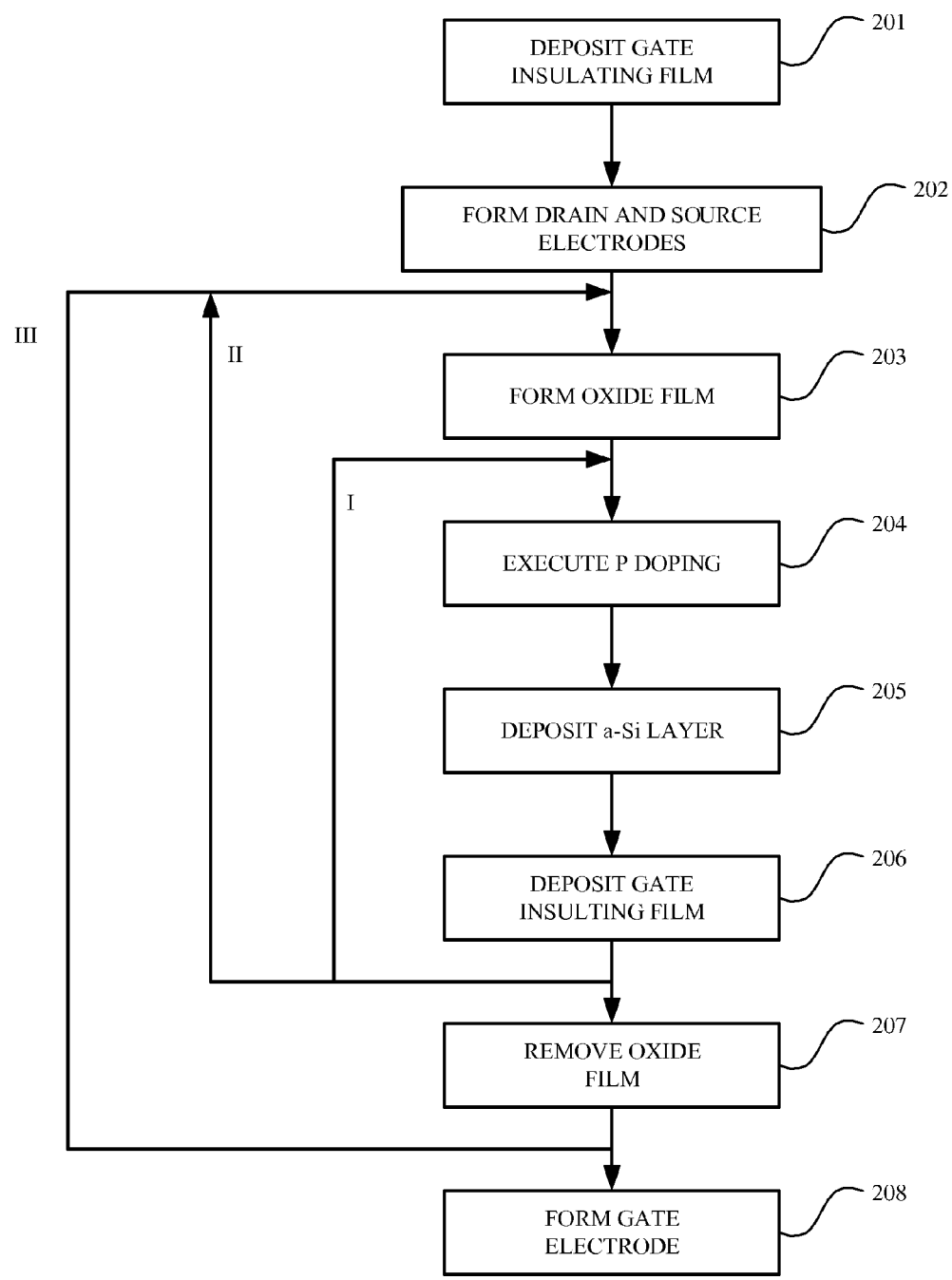
FIG. 2 is a flowchart showing a manufacturing process of the active matrix device including the top gate type TFT according to the present invention.

FIG. 2 is a flowchart showing a manufacturing process used by the present invention to manufacture the top gate type TFT shown in FIG. 1. In this top gate type TFT manufacturing process, in step 201, the insulating film 3 is formed on the glass substrate 1 having the light shielding layer 2 formed therein. Then, after the drain and source electrodes 4 and 5 are formed in step 202, an oxide film is formed on the inner wall of a processing chamber in step 203. Then, in step 204, plasma is formed by exciting a P supply source such as $PH_3$, and the drain and source electrodes 4 and 5 are doped with P. By such P doping, an N+ layer is formed from P contained in the drain and source electrodes 4 and 5 during the deposition of a-Si carried out after this doping step, and thereby a contact layer is formed.

After the doping step, in the top gate type TFT manufactured by the present invention, the a-Si layer 6 is formed in step 205, and then the gate insulating film 7 is formed by depositing SiNx on these structures in step 206. Then, the oxide film is removed when necessary like that in step 207. This removing step of the oxide film will be described in detail later. Further, in the top gate type TFT, the gate electrode 8 is formed in step 208. According to the manufacturing process of the present invention, the steps 204, 205 and 206 shown in FIG. 2 can be carried out in one and the same processing chamber.

Onto the oxide film, chemical species containing P are stuck only to an extent that subsequent steps are not adversely affected by the chemical species. Accordingly, after the formation of a top gate type TFT structure, while the oxide film is left intact, the process can return to step 204 to form a next top gate type TFT as indicated by the process II of FIG. 2. In addition, according to the present invention, after the top gate type TFT manufacturing like that indicated by the process II of FIG. 2 is executed by a certain number of times, without removing the oxide film, the process can return to step 203 to form a new oxide film in such a way as to cover the existing oxide film, and then further top gate type TFT manufacturing can be carried out.

Further, according to the present invention, as indicated by the process II of FIG. 2, after the top gate type TFT structure manufacturing is executed a certain number of times, the oxide film can be removed in order to maintain the characteristics of the manufactured top gate type TFT. Such an oxide film removal can be carried out, if SiOx is used as the oxide, by reacting it with a compound such as $SF_6$ or $NF_3$. If the oxide film other than the above is used, it can be removed by a conventionally known method such as used in a dry etching method. After the removal of the oxide film, as shown in FIG. 2, the process can return to the oxide film formation of step 203, and the manufacturing process of the present invention can be repeated from the step 203 of forming the new oxide film on the inner wall of the processing chamber.

In the manufacturing of the top gate type TFT by the method of the present invention, after the foregoing execution of P doping, the a-Si layer 6 and the gate insulating film 7 need to be formed by a CVD method or the like. According to the present invention, however, by seasoning or pre-coating the inner wall of the processing chamber with the oxide film so as to prevent the chemical species containing P from being stuck to the inner wall thereof, in the manufacturing process, the necessity of using a plurality of processing chambers is eliminated. Thus, the characteristics of the active matrix device including the top gate type TFT can be improved, and production efficiency can also be increased.

As for the sticking of the chemical species containing P on performing the doping as described above, absorption of the p-containing chemical species on the inner wall of the processing chamber or diffusion thereafter may occur. Therefore, the seasoning of the inner wall of the processing chamber with the film causing no adsorption or difficult adsorption if any of the P-containing chemical species generated by performing the doping can effectively prevent the sticking of the P-containing chemical species. The P-containing chemical species of the present invention mean, for instance, any chemical species containing $PH_3$ itself, and what generated in plasma using $PH_3$.

According to the present invention, the oxide film has been found to be most suitable as a film to be used for the seasoning or the pre-coating. For this purpose, various oxide films are available. For example, one may be enumerated from $SiOx$, $Al_2O_3$, $TiO_2$, $Al_2(Si_2O_5)(OH)_4$, $MgAl_2O_4$, $TaOx$, $ZrOx$, and other oxide films, all of which can be formed by any film formation method such as a CVD method or the like.

A particularly preferred oxide film according to the present invention is specifically a film containing SiOx. Such a film containing SiOx can be manufactured by various methods. For example, the film can be formed by mixing a compound for supplying Si atoms with a compound for supplying oxygen, and then using a proper film formation method such as a plasma CVD method or a thermal CVD method.

Regarding the compound for supplying Si atoms, one may be selected from $SiH_4$, $SiH_3F$, $SiH_3Cl$, $Si_2H_6$, $Si_3H_8$, $SiH_3(OCH_3)$, $SiH_2(OCH_3)_2$, $SiH(OCH_3)_3$, $Si(OCH_3)_4$, $Si_3(OC_2H_5)$, $SiH_2(OC_2H_5)_2$, $SiH(OC_2H_5)_3$, and $Si(OC_2H_5)_4$. For the compound for supplying oxygen, one may be selected from $N_2O$, $NO_2$ and $H_2O$. However, there should be no limitations place on these compounds, and any conventionally known compounds can be used. For forming an oxide film other than SiOx, one may also be selected from conventionally known compounds such as metal alkoxide.

Table 1 shows conditions for seasoning the inner wall of the processing chamber using SiOx as an oxide film. Table 2 shows a result of the sticking amounts of P elements originate from P-containing chemical species included in SiOx compared with that in the metal film, which was made by using Electron Spectroscopy for Chemical Analysis (ESCA), i.e., X-ray Fluorescence Spectroscopy (XPS). In this case, for the metal, MoW which is a representative metal used for various electrodes was used. In Table 2, each embodiment shows a result obtained under each condition shown in Table 1.

TABLE 1

| Condition | RF power (mJ/s) | Pressure (Pa) | $PH_3/H_3$ |
|---|---|---|---|
| Condition 1 | 500 | 99.992 | 2,000 |
| Condition 2 | 250 | 39.997 | 2,000 |
| Condition 3 | 500 | 39.997 | 1,000 |
| Condition 4 | 750 | 39.997 | 2,000 |
| Condition 5 | 500 | 39.997 | 3,000 |
| Condition 6 | 250 | 99.992 | 1,000 |
| Condition 7 | 750 | 99.992 | 1,000 |
| Condition 8 | 750 | 99.992 | 3,000 |
| Condition 9 | 250 | 99.992 | 3,000 |
| Condition 10 | 250 | 159.986 | 2,000 |
| Condition 11 | 500 | 159.986 | 1,000 |
| Condition 12 | 750 | 159.986 | 2,000 |
| Condition 13 | 500 | 159.986 | 3,000 |

TABLE 2

| Sample No. | P/metal | P/SiOx | Ratio |
|---|---|---|---|
| Embodiment 1 | 222.11 | 9.72 | 22.85082 |
| Embodiment 2 | 287.48 | 0.36 | 798.5556 |
| Embodiment 3 | 194.81 | 4.39 | 44.37585 |
| Embodiment 4 | 189.61 | 6.62 | 28.64199 |
| Embodiment 5 | 219.92 | 7.35 | 29.92109 |
| Embodiment 6 | 215.52 | 5.84 | 36.90411 |
| Embodiment 7 | 217.39 | 7.57 | 28.71731 |
| Embodiment 8 | 170.22 | 3.07 | 55.44625 |
| Embodiment 9 | 314.57 | 6.58 | 47.80699 |
| Embodiment 10 | 324.52 | 5.05 | 64.26139 |
| Embodiment 11 | 266.19 | 8.47 | 31.42739 |
| Embodiment 12 | 238.71 | 4.41 | 54.12925 |
| Embodiment 13 | 327.26 | 10.83 | 30.21791 |

As shown in Table 1, under a condition 2 where the RF output is low and the pressure inside the CVD processing chamber is low, the amount of P stuck to the metal is considerably smaller than that of P stuck to SiOx as indicated by the embodiment 2 in Table 2. Therefore, by coating the inner wall of the processing chamber with SiOx and selecting the condition for executing the P doping, the effect of P-containing chemical species can be prevented in subsequent steps, and the P doping and the formation of an a-Si layer 6 and a gate insulating film 7 can be carried out in a single processing chamber.

Figure 3:
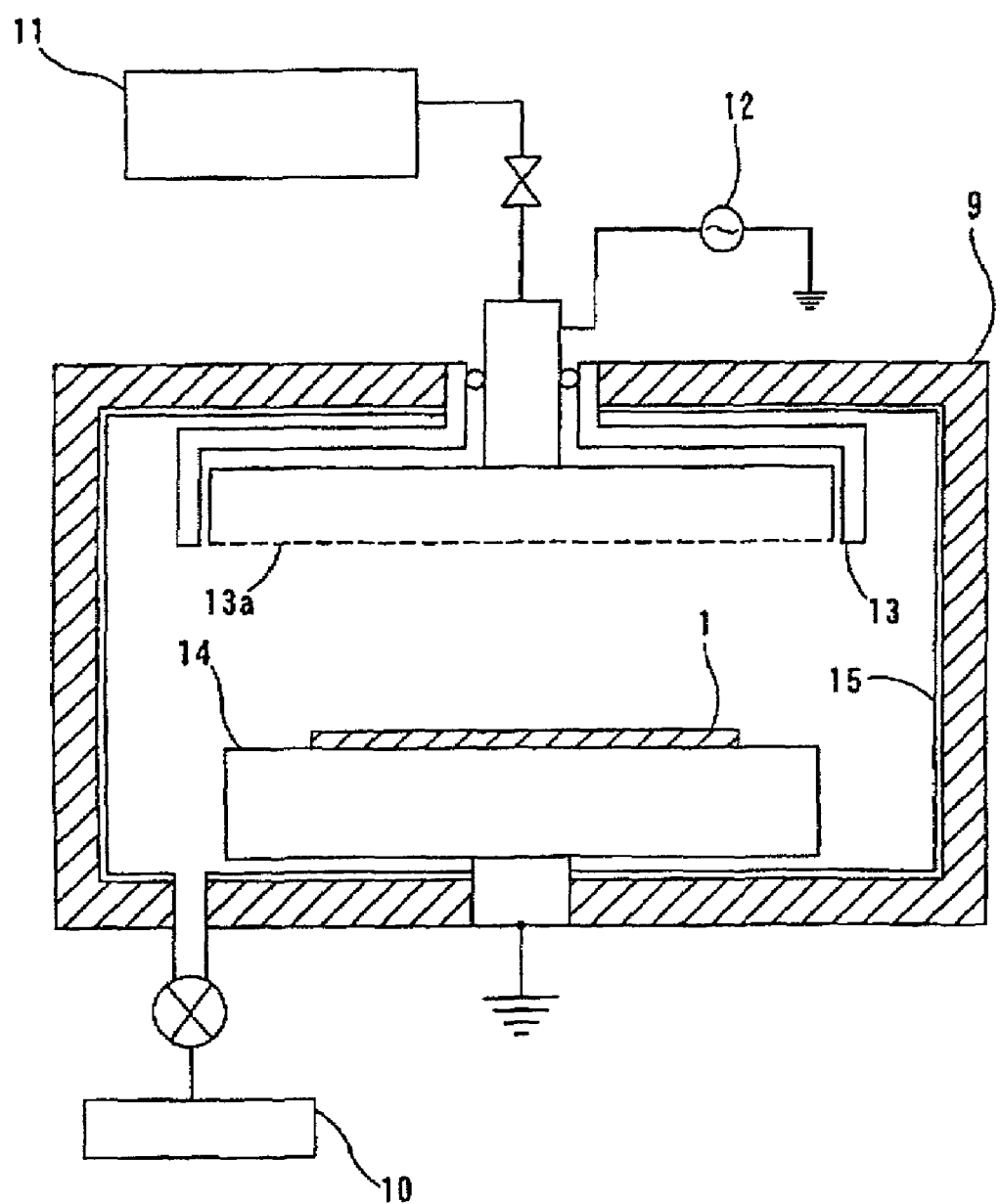
FIG. 3 is a schematic sectional view showing a manufacturing apparatus of the active matrix device including the top gate type TFT according to the present invention.

FIG. 3 is a schematic view showing in section the manufacturing apparatus of the active matrix device including the top gate type TFT of the present invention, which is constructed by using, for example the CVD processing chamber of a parallel flat-plate type. The manufacturing apparatus of the active matrix device including the top gate type TFT of the present invention comprises: a processing chamber 9 for executing a CVD process with the inside set in a vacuum state; a vacuum system 10 for reducing the pressure of the processing chamber 9; a gas supply system 11 for supplying a gaseous starting material used for film formation by a CVD method; and a high-frequency power source 12 for generating plasma in the processing chamber 9. An RF electrode 13 and a counter electrode 14 are arranged inside the processing chamber 9: the counter electrode 14 being set as an anode; and the RF electrode 13 as a cathode. The RF electrode 13 is formed in the shape of a shower head 13a for efficient film formation, and a film is formed on the glass substrate 1 set on the counter electrode 14.

As shown in FIG. 3, an oxide film 15 is formed on the inner wall of the processing chamber 9. This oxide film 15 can be formed by supplying a proper gaseous starting material from the gas supply system 11 before the P doping step, and then using, for example a plasma CVD method. The formation of this oxide film 15 can be executed as an initial step in the manufacturing process, or if possible between specified steps in the manufacturing process as occasion demands. As described above, by seasoning the inner wall of the processing chamber 9 with the oxide film 15 before the step of doping P, P-containing chemical species never or hardly get stuck to the inner wall of the processing chamber during the doping P step. Accordingly, the possibility of adversely affecting the subsequently-executed formation of an a-Si film and an SiNx film by the P-containing chemical species can be eliminated.

No particular limitation is placed on a thickness of the oxide film 15. If it is too thin, however, the inner wall of the processing chamber 9 cannot be sufficiently covered. To prevent the sticking of P-containing chemical species, a thickness of the oxide film 15 should preferably be set equal to 50 nm or higher, for example approximately 100 nm. In addition, to facilitate the deposition of the oxide film 15 on the inner wall, means for heating the inner wall may be provided in the processing chamber used in the manufacturing apparatus of the present invention.

Figure 4:
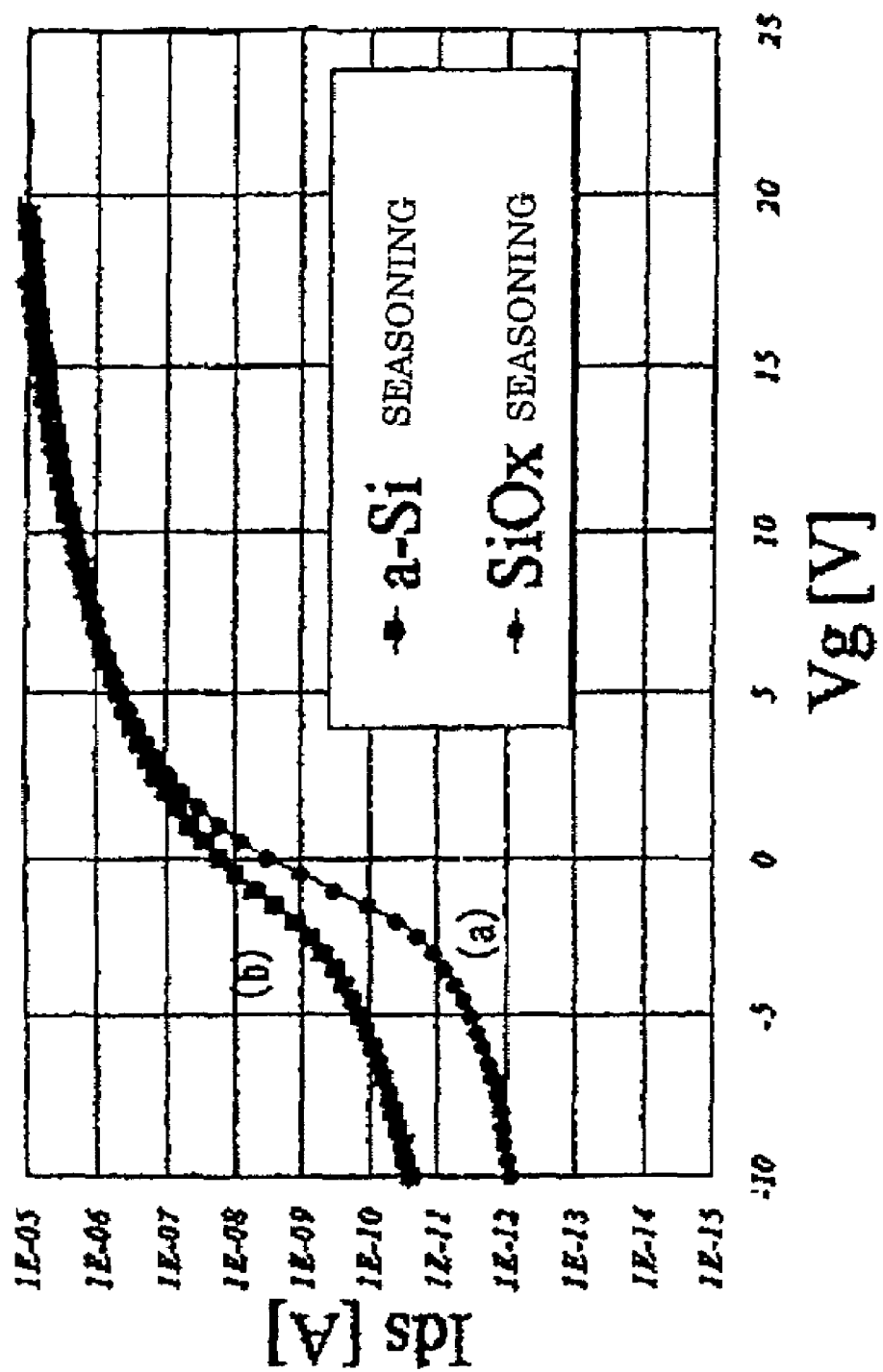
FIG. 4 is a graph showing a TFT characteristic of the top gate type TFT included in the active matrix device manufactured according to the present invention.

FIG. 4 shows a TFT characteristic of the top gate type TFT included in the active matrix device manufactured by the manufacturing method of the present invention. In FIG. 4, the TFT characteristic is shown with an abscissa set as a gate voltage and an ordinate set as a current Ids flowing between the source and the drain electrodes. A plot (a) of FIG. 4 indicates a TFT characteristic of the top gate type TFT of the present invention obtained by seasoning the inner wall of the processing chamber with SiOx. The seasoning by using SiOx to obtain the characteristic (a) of FIG. 4 used $SiH_4$ and $N_2O$ as gaseous starting material is obtained by forming the film on the inner wall of the processing chamber by the CVD method under the condition 2 of Table 1. A plot (b) of FIG. 4 indicates a TFT characteristic of the top gate type TFT obtained for the purpose to compare with seasoning the inner wall of the processing chamber with a-Si. As indicated by (a) of FIG. 4, a good OFF characteristic is obtained in the embodiment of processing chamber of which the inner wall is coated with SiOx. On the other hand, regarding the TFT characteristic of the top gate type TFT obtained by using the processing chamber of which the inner wall is coated with a-Si, an OFF characteristic is not enough and, it can be understood that the sticking of P to the a-Si layer 6 or the gate insulating film 7 gives the adverse effect.

Figure 5:
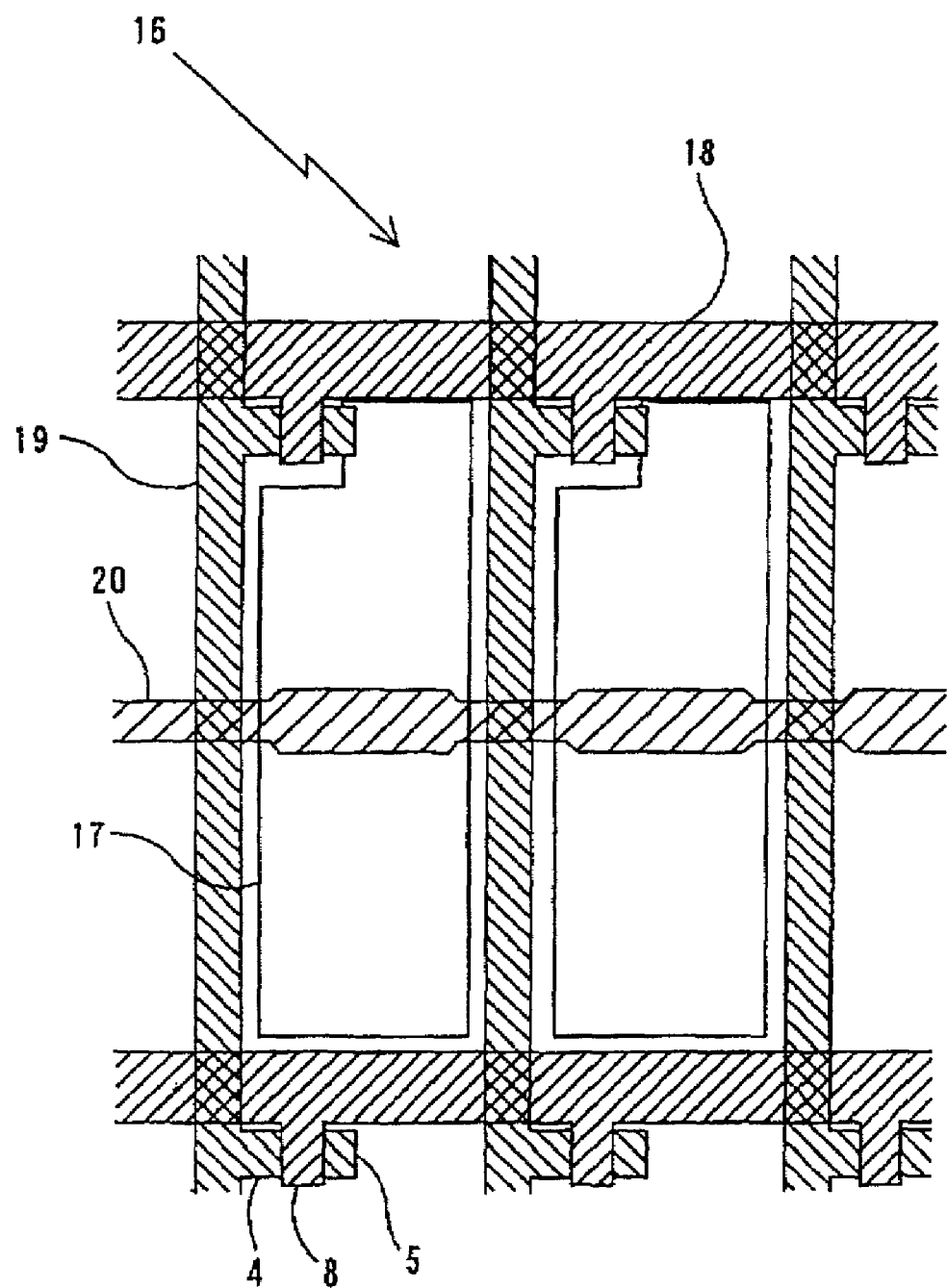
FIG. 5 is an upper surface view showing the active matrix device including the top gate type TFT manufactured according to the present invention.

FIG. 5 is a schematic upper surface view showing a pixel pattern of the active matrix device manufactured according to the present invention. The active matrix device shown in FIG. 5 includes a plurality of pixel electrodes 17 arranged on a TFT array substrate 16 using a-Si. In FIG. 5, a gate line 18 and a signal line 19 form a plurality of matrices to surround the pixel electrode 17, and at an intersection point thereof, the drain 4 and source 5 electrodes and the gate electrode 8 constitute a top gate type TFT. The pixel electrode 17 is made of a transparent conductive material such as ITO, ATO, $SnO_2$, IZO or the like. This pixel electrode 17 is connected to the source electrode 5 of the top gate type TFT, and the drain electrode 4 is connected to the signal line 19. The active matrix device shown in FIG. 5 may include a Cs line 20 for providing an accumulation capacity Cs.

For the active matrix device including the TFT array substrate 16 manufactured by the present invention, regarding a manufacturing process of the top gate type TFT other than that described above, any manufacturing methods and processes that have conventionally been known can be used. In addition, the active matrix device of the present invention can be used for driving, for example a liquid crystal display or an electroluminescence display. For the manufacturing of a similar active matrix device constructed by using the TFT array substrate 16, the use of the manufacturing method and the manufacturing apparatus of the present invention is preferable.

The present invention has been described in detail with reference to the embodiments shown in the drawings. However, the present invention should not be limited to the shown embodiments and, needless to mention, any conventionally known device structures for the top gate type TFT, materials for the respective components and film formation methods can be used for the present invention.

The invention claimed is:

1. A manufacturing method of an active matrix device including a top gate type TFT, which comprises a process of forming the top gate type TFT, wherein the process of forming the top gate type TFT includes the steps of:
    forming an oxide film specifically on a substantially entire inner wall of a CVD processing chamber, wherein the oxide film is selected from the group consisting of $Al_2O_3$, $TiO_2$, $Al_2(Si_2O_5)(OH)_4$, $MgAl_2O_4$, TaOx, ZrOx;
    arranging a substrate having source and drain electrodes formed therein in the processing chamber;
    doping the source and drain electrodes with P;
    forming an a-Si layer and a gate insulating film in the CVD processing chamber, wherein the step of doping the source and drain electrodes with P and the step of forming the a-Si layer and the gate insulating film are carried out in-situ in the CVD processing chamber; and
    wherein forming the oxide film specifically on the substantially entire inner wall of the CVD processing chamber is performed before doping the source and drain electrodes with P.

2. A manufacturing method of an active matrix device according to claim 1, wherein the process of forming the top gate type TFT further comprises the step of removing the oxide film from the substantially entire inner wall after the step of forming the a-Si layer and the gate insulating film.

3. A manufacturing method of an active matrix device according to claim 1, wherein the oxide film contains SiOx.

4. A manufacturing method of an active matrix device according to claim 1, wherein the active matrix device is a liquid crystal display.

5. A manufacturing method of an active matrix device according to claim 1, wherein the active matrix device is an electroluminescence display.

6. A manufacturing method of an active matrix device according to claim 1, further comprising heating the substantially entire inner wall of the CVD processing chamber so as to facilitate forming the oxide film specifically on the substantially entire inner wall of the CVD processing chamber.

7. A manufacturing method of an active matrix device according to claim 1, further comprising:
    depositing a first gate insulating film;
    forming the first gate insulating film before forming the oxide film on the substantially entire inner wall of the CVD processing chamber;
    depositing a second gate insulating film after forming the a-Si layer;
    removing the oxide film after depositing the second gate insulating film;
    wherein forming the oxide film on the substantially entire inner wall of the CVD processing chamber is performed before doping the source and drain electrodes with P; and
    wherein the step of doping the source and drain electrodes with P, the step of forming the a-Si layer, and the step of depositing the second gate insulating film are carried out in-situ in the CVD processing chamber.

8. A manufacturing method of an active matrix device according to claim 2, wherein the active matrix device is an electroluminescence display.

9. A manufacturing method of an active matrix device according to claim 3, wherein the active matrix device is a liquid crystal display.

10. A manufacturing method of an active matrix device according to claim 3, wherein the active matrix device is an electroluminescence display.

11. A manufacturing method of an active matrix device according to claim 2, wherein the oxide film contains SiOx.

12. A manufacturing method of an active matrix device according to claim 2, wherein the active matrix device is a liquid crystal display.

13. A manufacturing method of an active matrix device including a top gate type TFT, which comprises a process of forming the top gate type TFT, wherein the process of forming the top gate type TFT includes the steps of:
    forming an oxide film specifically on a substantially entire inner wall of a CVD processing chamber, the oxide film being at least 50 nm thick, wherein the oxide film is selected from the group consisting of $Al_2O_3$, $TiO_2$, $Al_2(Si_2O_5)(OH)_4$, $MgAl_2O_4$, TaOx, ZrOx;
    arranging a substrate having source and drain electrodes formed therein in the CVD processing chamber;
    doping the source and drain electrodes with P;
    forming an a-Si layer and a gate insulating film in the CVD processing chamber, wherein the step of doping the source and drain electrodes with P and the step of forming the a-Si layer and the gate insulating film are carried out in-situ in the CVD processing chamber; and
    wherein forming the oxide film on the substantially entire inner wall of the CVD processing chamber is performed before doping the source and drain electrodes with P.

14. A manufacturing method of an active matrix device according to claim 13, wherein the oxide film is approximately 100 nm.

15. A manufacturing method of an active matrix device according to claim 13, wherein the oxide film contains SiOx.

* * * * *